United States Patent [19]

Huang

[11] Patent Number: 5,095,454
[45] Date of Patent: Mar. 10, 1992

[54] METHOD AND APPARATUS FOR VERIFYING TIMING DURING SIMULATION OF DIGITAL CIRCUITS

[75] Inventor: Chi-Lai Huang, Billerica, Mass.

[73] Assignee: Gateway Design Automation Corporation, Lowell, Mass.

[21] Appl. No.: 357,076

[22] Filed: May 25, 1989

[51] Int. Cl.$^5$ .................... G06F 15/20; G06F 15/60
[52] U.S. Cl. ................................ 364/578; 364/488; 371/23
[58] Field of Search ............... 364/578, 488, 489, 490, 364/569; 371/23

[56] References Cited

U.S. PATENT DOCUMENTS

| | | | |
|---|---|---|---|
| 4,263,651 | 4/1981 | Donath et al. | 364/490 |
| 4,907,180 | 3/1990 | Smith | 364/578 |
| 4,916,627 | 4/1990 | Hathaway | 364/488 |
| 4,924,430 | 5/1990 | Zasio et al. | 364/578 |

Primary Examiner—Parshotam S. Lall
Assistant Examiner—Ellis B. Ramirez
Attorney, Agent, or Firm—Hale and Dorr

[57] ABSTRACT

A digital circuit simulation method and apparatus provide for critical path timing analysis of digital circuitry using a hybrid path tracing method. The hybrid path tracing performs path tracing when, for example, simulation values change at designated inputs. The path tracing can employ the simulation values for eliminating blocked paths. During tracing, the method and apparatus determine the shortest and longest paths from each input or beginning point to each end point. The end points are typically storage elements such as latches, flip-flops or systems outputs at a high functional level. The critical path tracing analysis finds the shortest and longest paths from the beginning point to the end point and records and saves the violation history, if any, associated with those paths. A timing template allows the user to develop the necessary input stimuli, in a logical ordered format to test the timing behavior of the digital circuit to be designed. Special procedures are also available for enabling the iteration of stimuli to check the timing of a transparent latch-based design. The system thus provides as an output either a summary or detailed history of violations at selected levels within the circuit to be analyzed. User input enables the system to isolate upon particular portions of the circuitry for determining correct operation.

32 Claims, 8 Drawing Sheets

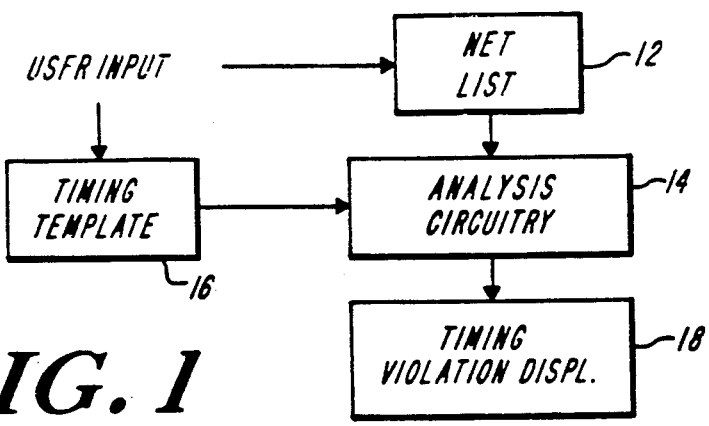
*FIG. 1*
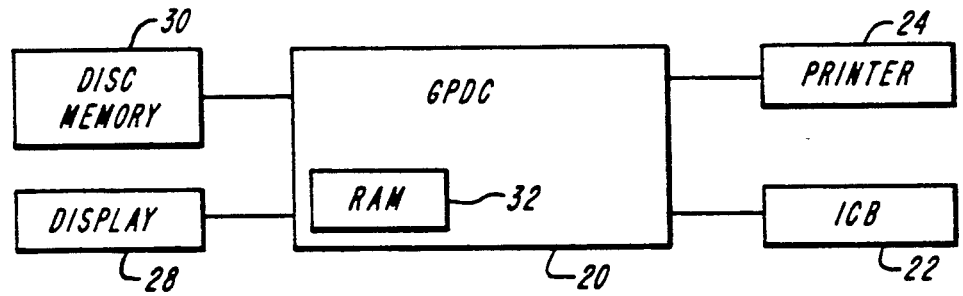
*FIG. 1A*
```
MODULE ADDER (ain, bin, cin, sum, cout)
    INPUT   ain, bin, cin
    OUTPUT  sum, cout
    XOR  #25      g1 (sum, ain, bin, cin)
    AND  #5       g2 (w1, ain, bin)
                  g3 (w2, bin, cin)
                  g4 (w3, bin, cin)
    OR   #(10,15) g5 (cout, w1, w2, w3)
END MODULE
```
*FIG. 2*

THE GATE MUST BE
AT "1" OR "X"

THE GATE MUST BE
AT "0" OR "X"

(TRANS IF "1")
GATE INPUT MUST BE
"1" OR "X"

(TRANS IF "0")
GATE INPUT MUST BE
"0" OR "X"

METHOD AND APPARATUS FOR VERIFYING TIMING DURING SIMULATION OF DIGITAL CIRCUITS

BACKGROUND OF THE INVENTION

The invention relates generally to a method and apparatus for testing of digital circuits and in particular to a method and apparatus for verifying timing of signals occurring during the simulation and testing of a digital circuit.

The use of computer simulation for verifying the logical operation of a digital circuit is well known In addition, there is often provided a timing analysis to ensure that a design works correctly, not only "logically," but when its detailed timing is taken into account. This analysis attempts to ensure that all component timing constraints will be satisfied during the operation of the design. The constraints can include the setup and hold times for an element and constraints such as the write enable timing to address a storage device such as a random access memory (RAM).

The timing analysis can further ensure that all high level timing specifications for the circuit design, such as the cycle time and timing of input and output signals, operate in accordance with the selected specifications. The analysis diagnoses timing problems which may be present and explain which portions or set of delays in the equipment are responsible for a particular timing problem. In this manner, therefore, the timing analysis aids the designer in finding a solution for a problem and for more quickly testing different strategies for repairing or fixing the problem The timing analysis also, in combination with the logical analysis, produces more consistent results, regardless of which of a batch of parts is used during manufacture This of course requires that each part be fully specified, including, for example, its minimum, maximum and typical delay times Further, the analysis aids the designer in selecting a cycle time for the circuitry, which, together with design strategies and methods, will result in a fast but correct operation.

The role of the timing analysis generally changes as the design process evolves In its early design stage, the main role of the timing analysis is to allow the designer to learn more about the design in an upper level manner. It will, for example, point out the critical paths and help to select a target cycle time. In addition, different design alternatives can be tested to determine which approach produces the best results In a later design stage, the primary goal is to ensure that the design operates at the selected speed or cycle time. During this phase, timing analysis determines whether the component and system timing specifications will be met during typical operations of the design.

Presently, the two common methods of performing timing verification are the static timing analysis and the dynamic timing analysis. A static timing analysis generally uses critical path analysis and works without pattern stimuli or any real time simulation. The goal of the static timing analysis is to complete a timing verification in a single pass. Since it is designed for only one pass through the circuit, it takes little computer time and can be used effectively only on designs with simple or no clock mechanisms. The results of the analysis, which can typically include a number of false violations, must be verified manually. For a complex design, the user must partition the design into separate sections and apply the static analysis, one section at a time. This is not only time consuming, but also error prone since the process must be enabled manually A dynamic timing analysis, for "min/max simulation," is a method for performing timing verification in a manner similar to the simulation used to do functional or logical verification. This method is simulation based and requires simulation patterns Like the logic simulation, the number of patterns required to achieve a high level of confidence in the results is large For each input pattern, the circuit will be simulated with a min/max delay. Hence a change on a wire happens with a minimum arrival time and a maximum arrival time The dynamic timing analysis requires substantial computer time to perform the analysis and the result is very dependent on the simulation patterns specified It is almost impossible for a user to specify all reasonable simulation patterns when the computer time costs are taken into account.

Accordingly, one is left with either a relatively simple static approach which requires substantial manual intervention when complex designs are used and wherein substantial numbers of false violations can be obtained or a dynamic timing analysis approach wherein substantial-computer time must be employed for even relatively small numbers of simulation pattern inputs.

It is therefore a primary object of the invention to provide a timing analysis method and apparatus which performs substantially complete timing analysis using all reasonable simulation pattern inputs without requiring excessive computer time, while maintaining the number of false violations to a minimum or none. Other objects of the invention are a method and apparatus which provide, using a few timing patterns, two paths through the circuitry which are the minimum and maximum path times from input node to output node Another object of the invention is for enabling a timing analysis to handle logical circuit loops and logical storage elements such as latches or flip-flops.

SUMMARY OF THE INVENTION

The invention relates to a method and apparatus for performing a time analysis simulation on a digital circuit design. The method features the steps of inputting the digital circuit design to the analysis system, simulating a logical function evaluation of the circuit design for each of successive simulation time instants, performing a timing analysis of the digital circuit design using a path tracing analysis of the design from designated inputs of the circuit design along paths fanning out from those inputs to the end points of the paths, and eliminating paths which would otherwise be subject to the path tracing analysis depending upon the results of the signal values from the previous simulation steps at the designated inputs.

In other aspects of the invention, the method features a hybrid path tracing method wherein path tracing occurs when the simulation values at designated inputs of the design change In yet another embodiment of the method of the invention, the violation history of only the longest and shortest paths will be saved for each timing violation.

The method of the invention further features allowing the user to designate input stimuli in a timing template for investigating the timing behavior of the digital circuit being designed and providing special latch handling methods for allowing the iteration of stimuli to be used to check the timing of a transparent latch based loop design.

The invention further features apparatus for inputting the digital circuit design to the analysis apparatus and circuitry for simulating a logical function evaluation of the design for each of successive simulation time instants Further circuitry performs a timing analysis of the digital circuit design using a path tracing analysis of the design from designated inputs to end points of signal propagation paths which begin at the designated inputs. The apparatus provides circuitry for eliminating paths subject to the path tracing analysis depending upon the signal value results of the simulation step at the designated inputs.

The apparatus of the invention further features a hybrid path tracing apparatus for analyzing the design from the designated inputs to end points of the signal propagation paths which begin at the designated inputs whenever the value of the signals at the designated inputs vary as a result of the logical simulation step. In yet another aspect of the apparatus of the invention, the violation history of only the longest and shortest paths of the analysis will be saved by the apparatus corresponding to each timing violation.

In yet another aspect of the apparatus of the invention, circuitry for inputting a user specified timing template is provided and further elements for setting the input stimuli with regard to at least one of the designated inputs, in accordance with the user specified timing template, is employed for determining the timing behavior of the digital circuit being tested. Circuitry is provided also, in a preferred aspect of the invention, for iteration of stimuli at designated inputs for checking the timing of the digital circuit design for a loop containing transparent latches.

BRIEF DESCRIPTION OF THE DRAWINGS

Other objects, features, and advantages of the invention will be apparent from the following description taken together with the drawings in which:

FIG. 1 illustrates a simple configuration for enabling the method and apparatus in accordance with the invention;

FIG. 1A illustrates a typical hardware configuration for operating a software implementation of the invention;

FIG. 2 illustrates a simple network listing used as an input to the method and apparatus in accordance with the invention;

DESCRIPTION OF A PREFERRED EMBODIMENT

Figure 3:
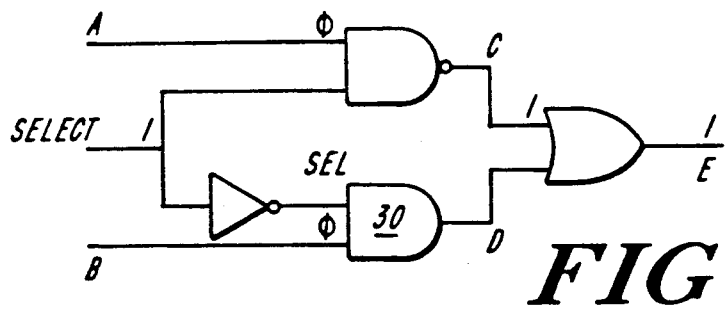
FIG. 3 illustrates a simple circuit illustrating the concept of simulation elimination.
Figure 4A:
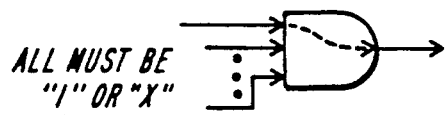
FIGS. 4A-4H illustrate the use of simulation elimination for a circuit at the gate/transistor level.
Figure 4B:
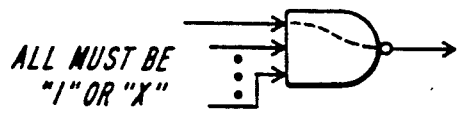
Figure 4C:
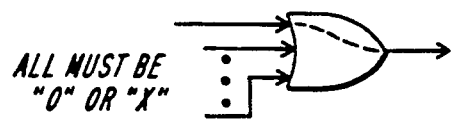
Figure 4D:
Figure 4E:
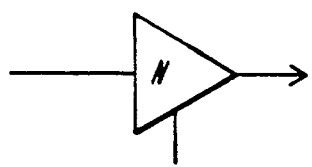
Figure 4F:
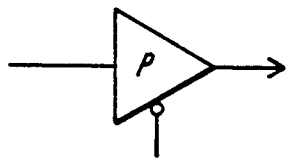
Figure 4G:
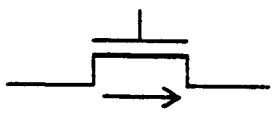
Figure 4H:
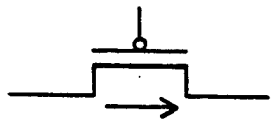

Referring to FIG. 1, in accordance with the invention, the user specifies the digital circuit which he will be employing in a plurality of "net lists" stored in a storage 12 which are one of the inputs to the analysis circuitry 14. A second input to the analysis circuitry is a timing template stored in a storage 16 also specified by the user. The timing template provides for the timing stimuli at inputs to elements which are incorporated into the net list The user input can be provided for example through a keyboard terminal.

The timing behavior of the elements is specified in a timing construct designated a "specify block." Typically, the timing behavior for many elements are well known and are common to a number of digital circuits. Thus, the delays inherent in passing through an AND gate or an OR gate, or passing through a transistor are well known and are among the elements specified in the net list 14. Other elements, however, such as flip-flops, latches, and RAMs, must be specified using the specify blocks. The construction of the specify block is described hereinafter. With the network configuration from elements 12 (including the specify blocks), and the timing templates from elements 16, the method of the invention then employs the circuitry of element 14 to effect the timing analysis. The results of the analysis are the timing violations 18 output from the system for viewing and use by the end user.

The timing analysis operates in parallel with the functional or logical simulation of the circuitry to be checked In order to effectively perform the simulation and timing analysis, the invention can be constructed in either hardware, software, or a combination of the two. In the illustrated and preferred embodiment of the invention, the analysis timing, the network lists, and the timing templates are all implemented on a general purpose digital computer 20 and are performed in software. A typical hardware environment on which to run the software to be described hereinafter, referring to FIG. 1A, has a general purpose digital computer 20 which can be an IBM AT style computer, for example, to which are connected a keyboard 22 for providing alphanumeric input to the computer, a printer 24 for providing alphanumeric or dot matrix output information from the computer, a display terminal or monitor 28 for providing visual information to the user including, for example, a display of the circuitry being tested and any violations which may be found, and a mass storage device such as a disk memory 30. The computer further has substantial RAM 32 in order to perform, as fast as possible, the operations to be described hereinafter. In the description which follows, the operation and flow of the software will be detailed and described.

In general operation, once the overall circuit configuration has been input to the system, whether by keyboard, by a previously created file in memory, or otherwise, a simulation program such as Verilog begins to operate. (Verilog is a commercially available simulation analysis system software marketed by Gateway Design Automation Corporation of Lowell, Massachusetts.) After each simulation time or instant of the simulation analysis at the logical or behavioral level, the timing analysis operates using as "landmarks" primary inputs designated by the end user. As signals change at those primary inputs, whether the changes be forced by end user input or occur as a result of a signal change of a simulation value at the input, the timing analysis method propagates those changes and checks for correct timing, typically at each storage or related element encountered in a path. The timing checks are, as noted hereinafter, specified by the end user. Typically, when a storage device such as a flip-flop or latch is encountered, the timing analysis stops a first propagation path and begins a new propagation path at the output of the storage device for reasons to be described hereinafter. In this manner, local or global loops can be easily accommodated. The timing analysis is "aware" of the next simulation time and accordingly, all signal propagation occurring prior to that time is completed, any timing violations are noted, either immediately or saved for later viewing, and thereafter, the next simulation analysis takes place with a timing analysis process occurring thereafter. Thus, the functional simulation and the timing analysis are, in effect, multiplexed by the operation of the present invention. This method of operation is described in greater detail in connection with FIG. 14.

The simulation system and the timing analysis of the present invention are organized in a hierarchical relationship so that the initial timing analysis can be performed at a relatively high, functional level (so long as the timing constraints are specified) and once that level of circuitry has been "proven," a more detailed functional circuitry can be analyzed. Thus, referring to FIG. 2, a simple one-bit adder, which will be implemented eventually at a gate level, is described using a net list at a logical level. The net list of FIG. 2, which will be input and stored in a memory 12, describes completely the logical flow of the circuit elements of the adder to be simulated and analyzed. Elsewhere, according to the invention, the adder will be connected to storage devices and the timing data for each of the storage devices, specifying hold times, setup times, delay times, etc., to the extent applicable to the element, are described in the specify blocks. Further, at a yet higher level, the entire adder module can be described in a specify block for providing overall (and simpler) operation of the adder so that the timing and path relationships between the inputs $a_{in}$, $b_{in}$, and $c_{in}$, and the sum and carry outputs (sum, $c_{out}$) can be specified. The logical descriptions such as that of the net list of FIG. 2 are entered into the network list in a hierarchical net list format. The network can then be described at various levels of complexity by the net list and accordingly in similar levels of specificity by the timing template.

As will be described further, the user can analyze the timing behavior of the circuit he designs using either critical path tracing or hybrid path tracing. The critical path tracing enables the user to find the shortest and longest paths from a specified primary input or inputs to the specified inputs for a circuit element (typically referred to as a clock input and a data input). The user can start the critical path tracing when a particular input pattern has been simulated. In this way, the longest and shortest paths which are found will be restricted to the region defined by those simulation values. Once the critical paths are found, the user would then manually check whether the paths found cause any violation.

However, by using a hybrid path tracing approach in accordance with the illustrated embodiment of the invention, the critical path tracing and manual determination of violations are combined and performed automatically. The user thus prepares the timing template, stored in memory 16, which describes the input stimuli to be applied to the circuitry. The simulation value changes are set for user specified "primary inputs" which will trigger the critical path tracing from those specified primary inputs to the inputs of those modules having timing checks The method then compares the results of the analysis to determine whether a timing violation occurs. As will be described later, the user preferably provides primary inputs to cover those logical paths of interest in the design but not paths which will never actually be used.

The digital circuit description illustrated at 12, in the preferred embodiment of the invention, is described using Verlog, a hierarchical, mixed-level hardware description language Verlog is described, in detail, in connection with the commercially available Verilog simulation analysis system software marketed commercially by Gateway Design Automation Corp. of Lowell, Mass. Each element of the circuit is described as a module. A module can be described in terms of other internal modules or gates or transistors, and thus provides a hierarchical description where an adder, for example, can b described in terms of its component bit-addition sections, which in turn can be described in terms of their gates.

At the heart of any timing analysis performed in accordance with the invention are the delays which are specified for the model of the design. Delays can be associated with any module and hence can be specified not only for gates and wires, but for entire paths, from input to output, for a module. In addition, and more importantly, each delay can be expressed as a range of times bounded by certain minimum and maximum values Thus, the actual delay that a component or module contributes can fall anywhere within the indicated range. This uncertainty is often referred to as the minimum or maximum, that is, the "min/max" delay. Each element may have its delay specified as two distinct min/max ranges so as to model both the signal rise and signal fall conditions with separate delays Further, the delay from any source on a wire to each different load on that wire can be specified separately. In accordance with the invention, users can specify very accurate delays for an entire design. These delays are the basis of all the results produced by the timing analysis and good results depend largely on the degree of accuracy which the user employs when modeling the delays in the design.

As noted above, the timing specifications for each module can be specified by the user, and the "object" used to specify those timing specifications is termed a "specify block." A specify block can be used to assign delay characteristics to any path through a module, including modules which are modeled solely at a behavioral (logical) level This capability allows the use of a top down methodology wherein timing can be first verified at a higher logical or behavioral level before any gate level construction is required.

In accordance with the invention, modules may have their delays specified by the gates and other elements within the module. Nevertheless, at a higher level, a specify block can be employed to override the internal specifications of the module and to assign new, perhaps different, delay characteristics to each of the various paths through the module The specify block can also be employed with an otherwise "empty" module to simply define the delays which are anticipated to be associated with the various paths through the module. In a simple case, the specify block can also be employed to set the signal value relationship between the output and input associated with each path. Such a specify block declaration of a module can be employed as part of an overall design to provide timing continuity between input and output even though the actual functionality of the module has yet to be implemented. Thus, the primary purpose of the specify block is to contain declarations of paths within the block and to provide timing limits with regard to the input and output ports. The specify block also includes timing checks to determine and ensure that the signals maintain a correct timing relationship.

In accordance with the invention, if a single higher level path declaration is provided for a module, any internal description of the module will be ignored. Accordingly, any time a specify block is assigned to a module, the module must be completely described by the block As an example, a specify block may take the following form:

specify
   $(A_{in} => Q_{out}) = 8:10:13;$
endspecify

The left-hand side of the declaration, the "path description," identifies a path from the module input A to the module output Q. The right-hand side of the declaration contains the delay characteristics associated with the path, in this instance, a delay of between eight and thirteen nanoseconds, with an average delay time of ten nanoseconds The term "module input" as used herein, refers to an input port or a bidirectional in/out port that serves as the source for one or more pats through the module. Similarly, the term "module output" refers to an output port or an in/out port that serves as a destination for one or more paths through the module. Often several paths will share the same set of delay characteristics and can be defined using a single path declaration as described in more detail in the Verilog system documentation. In addition, each path can also specify, using a specify block declaration, the polarity to be associated with the path. By "polarity" is meant a means for establishing the value relationships between a module input and a module output. A path declared with a positive polarity means that a rise at the input will produce a rise at the output. Similarly, a path declared with a negative polarity denotes a path wherein a rise at the input results in a fall at the output.

The path declaration can also employ conditional paths, that is, paths wherein the output specified by the declaration depends upon the signal condition or conditions at one or more of the inputs to the module The condition may be a level sensitive condition, as in the case of a "transparent" latch, or it may be an edge sensitive condition as in the case of a flip-flop. The specify block can handle both types of conditional path in its declaration. In addition, the sensitivity may be different depending upon whether one is describing a positive edge or a negative edge. Accordingly, the declaratory statement can further take this change of directional value into account.

In accordance with the invention, the total delay along a path is performed by taking the sequence of gates, modules, and wires through which signal changes might flow during operation of the design and adding those delays for each element of the path. In addition, according to the invention, the propagation of a signal change can be followed from the beginning of the path through to the path's end point. The signal at the end point can be either a rise or a fall depending upon the conditions at the input which produce the change of value Since the cumulative delay through the path may differ depending on the polarity of the change, there may be two separate delay paths, a rise path and a fall path, associated with each physical path through the circuit. In accordance with the invention, both the rise and fall paths are analyzed separately. For each rise or fall path, the inventive method keeps a separate record of the minimum and maximum delays. As a result, there is associated with each physical path to be analyzed, four different values calculated for their cumulative delay: a minimum rise time delay, a maximum rise time delay, a minimum fall time delay, and a maximum fall time delay.

Since a typical design may have a very large number of potential paths through it for a selected stimulus and end point, it may be impossible to inspect every possible path for each change of input values The method operating through the analysis circuitry 14, for example, thus selects the longest and the shortest path to any end point out of the large number of possible paths and the two selected paths are then used as the critical boundaries which determine the timing variation at the common end point. The time range which is thus determined provides the full range of possible signal change arrival times at the specified end point.

The existence of feedback loops is also an important consideration affecting the path analysis. Feedback loops can pose problems to path analysis because their presence will create an infinite number of possible paths through the circuit. In accordance with the invention, several methods can be employed for analyzing feedback loops depending upon whether they are local loops, that is, small loops typically present at the gate level description of a basic storage device, or global loops, that is, major loops used for defining the various cycles for the design. For certain design strategies, such as those wherein the feedback loops are implemented in a fairly unstructured manner, users of the inventive method will need to understand the invention's loop handling methods in detail.

In accordance with a preferred embodiment of the invention, the results of simulation and the particular values to be applied at the inputs are employed by the analysis system 14 to eliminate paths during the path tracing portion of the method Thus, referring to the example of FIG. 3, there are four possible paths from the inputs on the left to the output "E." Those paths are: "A" to "C" to "E", "SELECT" to "C" to "E", "SELECT" to "SEL" to "D" to "E", and "B" to "D" to "E". However, if the simulation values are taken into consideration, some paths will not be valid because they are blocked.

Thus, when "SELECT" equals "one," the path "A" to "C" to "E" is valid but the path "B" to "D" to "E" is not valid since it is blocked by the simulation value "one" on the line "SELECT" which causes "SEL" to be a "zero." This blocks the AND gate 30 of the path in FIG. 3. Thus, in path tracing, the value on the path will not be used to eliminate the path, but the value can be used to eliminate paths from other inputs. For example, if "A" equals a "zero" at the current simulation time, it will not eliminate the path "A" to "C" to "E", but it will eliminate the other path, "SELECT" to "C" to "E."

Referring then to FIG. 4, there is illustrated a selection of gate structures and values used at the input(s) to the gates which will not cause other paths to be eliminated. Thus, the simulation values are employed to define a region in which the longest/shortest (max/min) paths are found. This provides the user with a very powerful method for specifying the region in which he is interested; that is, rather than requiring the user to explicitly define the boundaries of the region, the method allows him to use the simulation values to define the boundaries by employing the method of the invention.

Figure 5:
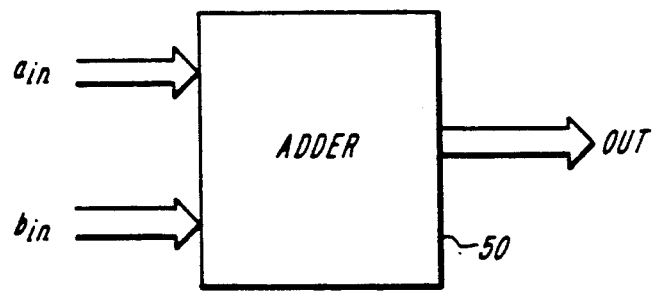
FIG. 5 illustrates a simple decimal adder circuitry.

The regions specified using the simulation values can be combined or united so that path tracing can find the shortest and longest paths when the input has a restricted range. For example, referring to FIG. 5, the input range to a decimal adder 50 is limited to 0-9 (the decimal digits) rather than 0-15 (the full range of the four-bit binary input). To find the longest path for the allowed range of inputs to the decimal adder, four steps can be performed:

(i) the input $a_{in}$ equals 0XXX and the input $b_{in}$ equals 0XXX;
(ii) the input $a_{in}$ equals 0XXX and the input $b_{in}$ equals 100X;
(iii) the input $a_{in}$ equals 100X and the input $b_{in}$ equals 0XXX; and
(iv) the input $a_{in}$ equals 100X and the input $b_{in}$ equals 100X, where X can be either a "0" or a "1."

The longest path is the longest of the traced paths for the four steps, while the shortest path is correspondingly the shortest of the traced paths for the four steps. This approach can be employed in a generalized form for as many regions as required.

Since storage devices represent a special class of defined block or module, the storage devices are described in more detail herein. Generally, as noted above, the various modules and gates/transistors can be modeled as described more fully in the documentation accompanying the Verilog system descriptions.

The delay characteristics of a transparent latch are described in a specify block using two conditional paths, one of which represents a level sensitive path and the other of which represents an edge sensitive path. When the clock is high, the latch is transparent and any change at the input will be propagated to the output. This is the level sensitive path through the latch and, as noted above, is a conditional path, dependent upon the clock having a high value. In this transparent state, the delay through the latch is straightforward, that is, the delay is specified between the data input and the data output. When the latch "closes," that is, when the clock goes low, a change in value at the input will not be propagated through to the output and instead, the latch waits for the next rising edge of the clock before the data at its input is allowed to propagate through to the output. This is an edge sensitive conditional path through the latch and is specified as a separate path dependent upon the clock rising edge. In this case, it is when the clock changes, not when the data changes, that controls the delay. Thus, a delay path is established between the positive edge of the clock and the output of the latch and the specified delay applies not to the data path but to this clock controlled path.

A flip-flop is slightly different than the latch, since the flip-flop has no transparent state. The level sensitive path required for the latch is not needed for the flip-flop and accordingly a simple flip-flop can be described with simply an edge sensitive path. However, the flip-flop status becomes more complicated when the clear input to the flip-flop is considered. Thus, for example, to model a D-type flip-flop with an asynchronous clear signal, the specify block must include a conditional path dependent upon the value of the clear. The D-type flip-flop thus contains two edge sensitive paths, and the output of the device can only change in response to a transition at either the clear input or the clock input. Since the clear input takes precedence over the clock input, the edge sensitive path through the clock input must be made conditional upon the state of the clear input. Therefore, an "IF" construction (conditional path) is employed as the first statement in the specify block to limit the effect of a clock pulse to a time when the clear input is not active.

In order to determine, once the min/max times are calculated for a given circuit, whether a timing violation has occurred, the method and apparatus of the invention provide for a variety of defined timing checks for modeling the different timing constraints imposed by various devices and in particular the storage devices. Each timing check is incorporated into a module description using the specify block. In connection with a timing check, it is the various inputs to the module (corresponding to the end of a path) which are considered and it is important to recognize that an edge sensitive timing which typically might be associated with a "clock" signal need not be limited to such a signal but can stand for any reference signal with which a data (level) signal is to be compared. In all timing checks, therefore, the arguments "clock" and "data" are qualified with an optional edge description where the edge description can be either a positive edge or a negative edge. If the edge description is not provided in the timing statement or timing check, the method considers both the transition from a "zero" to "one" (a positive edge) as well as the transition from "one" to "zero" (a negative edge transition).

Figure 6:
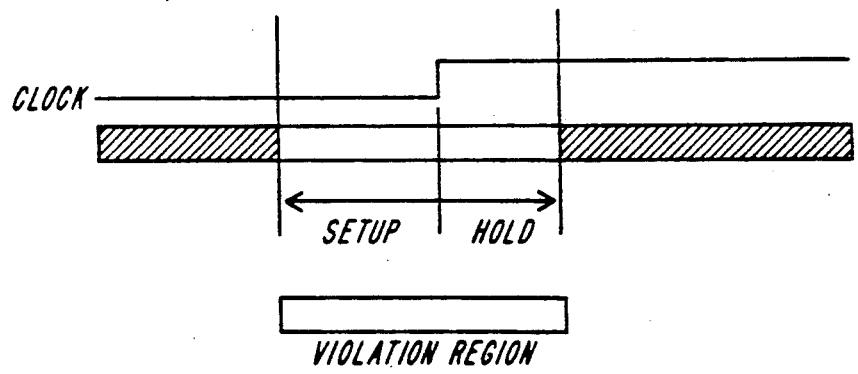
FIGS. 6-12 illustrate the use of timing checks for determining timing violations in accordance with the invention.
Figure 7:
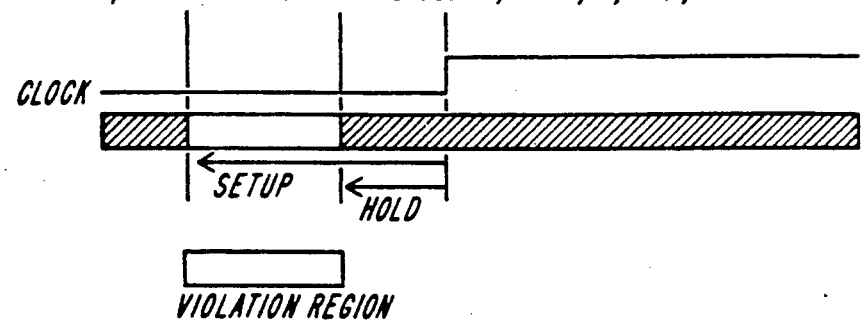
Figure 7:
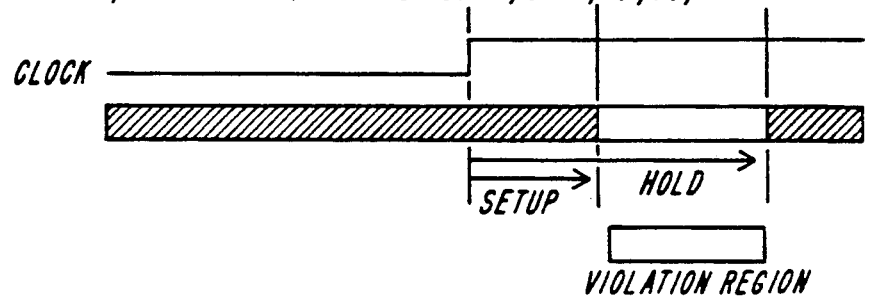

Among the more important timing checks are the SETUPHOLD check which is used to specify the setup and hold times for storage devices such as latches, flip-flops, and registers. The basic principal behind the setup and hold requirements is that the data signal must remain stable for a specified minimum time period relative to the clock signal transition to successfully store the data (setup) and must further remain stable for a further minimum period in order to hold the data. Any change in the data signal within the specified time limits results in a timing violation. This is illustrated in FIG. 6. Note that the hold time is measured forward in time and the setup time is measured backward in time. This is true when both the setup and hold parameters are positive; however, these parameters can also be expressed as a negative number in order to shift the violation region relative to the clock transition as illustrated in FIG. 7.

Any change in the data signal value that occurs within a violation region will result in a timing violation. For purposes of definition, any change that occurs exactly at the limit of the region is not considered a violation. This is applicable not only to the SETUPHOLD timing check but to all timing checks to be described in connection with the illustrated embodiment of the invention.

In addition to the SETUPHOLD timing check, the illustrated embodiment of the invention also provides for a SETUP and a HOLD timing check, each of which can be used separately. The arguments of the SETUP and HOLD timing checks can e positive or negative and the two checks are collectively equivalent to the SETUPHOLD timing check described above.

Figure 8:
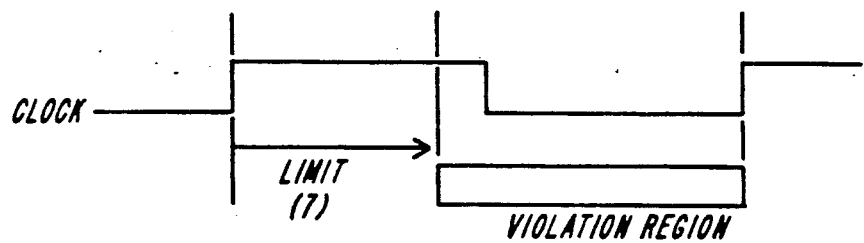

A SKEW timing check is employed when the data signal is only allowed to change within a specified period following the clock transition. Thus, the SKEW timing check defines a time range during which it is acceptable for the data signal to change. The argument to the SKEW timing check, which can only be positive, establishes the region as measured from the clock transition. The timing diagram illustrated in FIG. 8 shows this relationship. If the data signal changes outside the selected region, a timing violation occurs. Thus, the SKEW timing check can be used on a pair of related clock signals to ensure that they do not drift too far apart in time.

Figure 9:
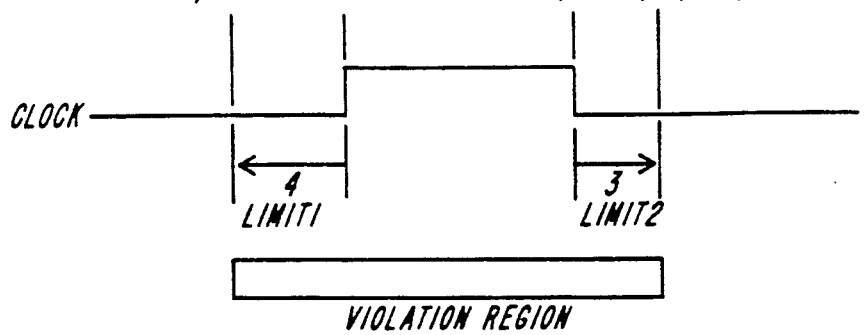
Figure 9:
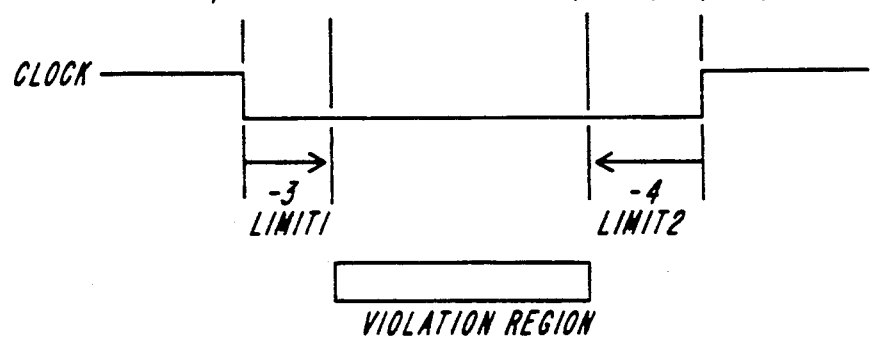

A NOCHANGE timing check is used to define a violation region relative to the width of a clock pulse. It is used, for example, to model the timing constraints of memory devices, for example, when address lines must remain stable during a write pulse. Referring to FIG. 9, two limits are provided and are used to expand or shrink the violation region with respect to the pulse edges. A positive value for the first limit, limit one, operates to widen the violation region with respect to the leading edge of the pulse while a positive value for limit two widens the region with respect to the trailing edge of the pulse. Negative limits can be employed to shrink the violation region.

Figure 10:
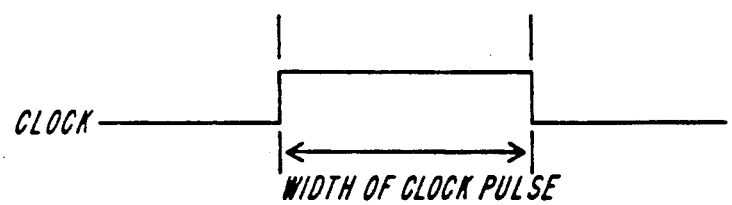

A WIDTH timing check monitors the width of a signal pulse and reports a violation for any pulse that is less than a specified limit, as illustrated in FIG. 10. An optional edge description on the clock signal, according to the invention, forces the system to monitor only a positive or negative pulse. If no edge description is specified, the system monitors all pulses regardless of polarity. A violation is reported for any pulse width that is less than the limit value. A second limit can be provided to filter out harmless spikes or noise glitches which may occur and thus any pulse width less than the second limit will be ignored by the timing check.

Figure 11:
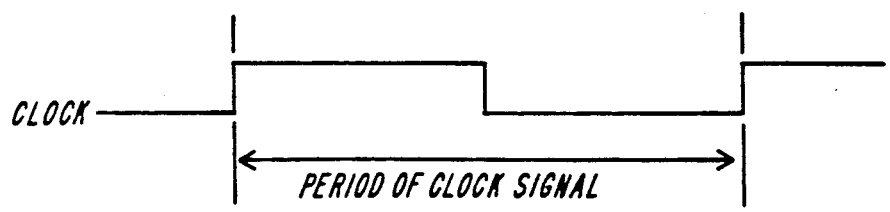

Finally, a PERIOD timing check can be employed to monitor the period of a clock signal and report a violation when the period is less than a specified limit. Referring to FIG. 11, therefore, the period timing check measures the time from like edge to like edge (that is, from positive edge to positive edge or from negative edge to negative edge). The clock period must be greater than or equal to the specified limit value to avoid a timing violation. This timing check records only the length of a clock period, not its symmetry.

Figure 12:
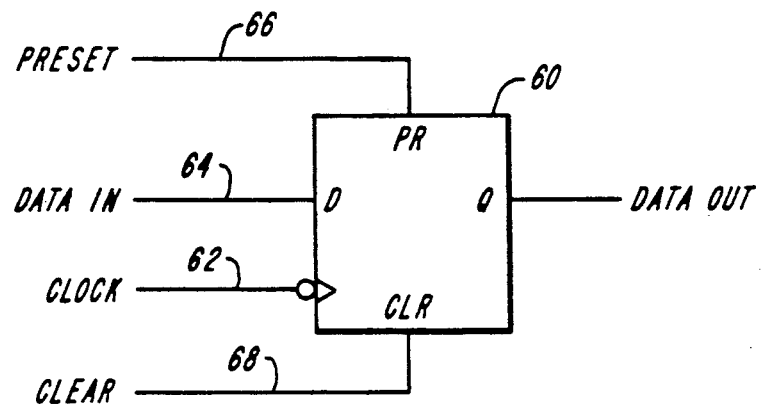

Any of the timing checks previously described can be expressed as a conditional timing check wherein it is activated only upon conditions at other inputs to the module being described. Thus, for example, a latch illustrated in FIG. 12, a D-type latch (flip-flop) 60, is transparent when the clock 62 is high and latches the last value on the data input 64 when the clock drops to low. The preset line 66 forces the output high at any time. The clear line 68 forces the output low at any time. When both are asserted at the same time the clear line overrides the preset line. This storage element can be modeled using two WIDTH timing checks which are dependent upon the clear pulse and the preset pulse, that is, by forcing the clear pulse to have a width greater than a first value and the preset pulse to have a width greater than a smaller value, the clear signal will override the preset and any event at the preset is ignored while the clear is active. Furthermore, since the circuit is not concerned with a preset input under these circumstances, the WIDTH timing check that monitors the preset is made inactive during this time; otherwise, false violations could result. Conditional timing checks are an effective device for reducing the number of false violations produced by the timing analysis. By deactivating a timing check during times when its associated inputs are to be ignored by the storage device, meaningless violations can be avoided and the user is permitted to concentrate on the results which are valid.

Hybrid Path Tracing

The logic designs of interest typically have many sections of purely combinational logic where data signals simply flow through the logic and are subject only to various propagation delays. Each combinatorial section is usually followed by one or more storage devices which are employed for saving the results of the combinatorial logic for a next machine cycle. The primary function of the timing analysis to which the invention is directed is to ensure that the data flows through the combinatorial logic in time to meet the timing constraints imposed by the storage devices. Those timing constraints, for each storage device, are modeled using the timing checks noted above.

When timing checks model a particular storage device, the method of the invention performs a path analysis of the circuit design to determine if the specified timing constraint(s) will be met. Using the static path tracing algorithm previously discussed, the method propagates the signal changes through the combinatorial logic and traces each critical path from the primary inputs or storage device outputs, to the storage device input (the end of the path). The result of the signal tracing provides minimum and maximum delays corresponding to the longest and shortest paths from the primary inputs (or storage device output) to each path end. These critical paths provide the method and apparatus of the invention with precise data regarding when a signal change could arrive at each path end.

The arrival times, calculated in this fashion, always have a range of values; and the signal change at the path end could thus occur between a certain minimum time and a later maximum time. The range of time is thus the difference between the minimum arrival time corresponding to the shortest path and the maximum arrival time corresponding to the longest path. Once the range of possible arrival times for each input to a device (the path end) is known, the method according to the invention compares that range with the range of arrival times for a clock input corresponding to that data input. The system then evaluates this relationship according to the rules specified in the various timing checks for the module (declared in the specify block for the module), and if there is any possibility that an error may occur, a timing violation will be reported. The system provides for reporting those violations immediately, or, if the user prefers, at a later time wherein all timing violations can be viewed in either summary or full data output format.

Figure 14:
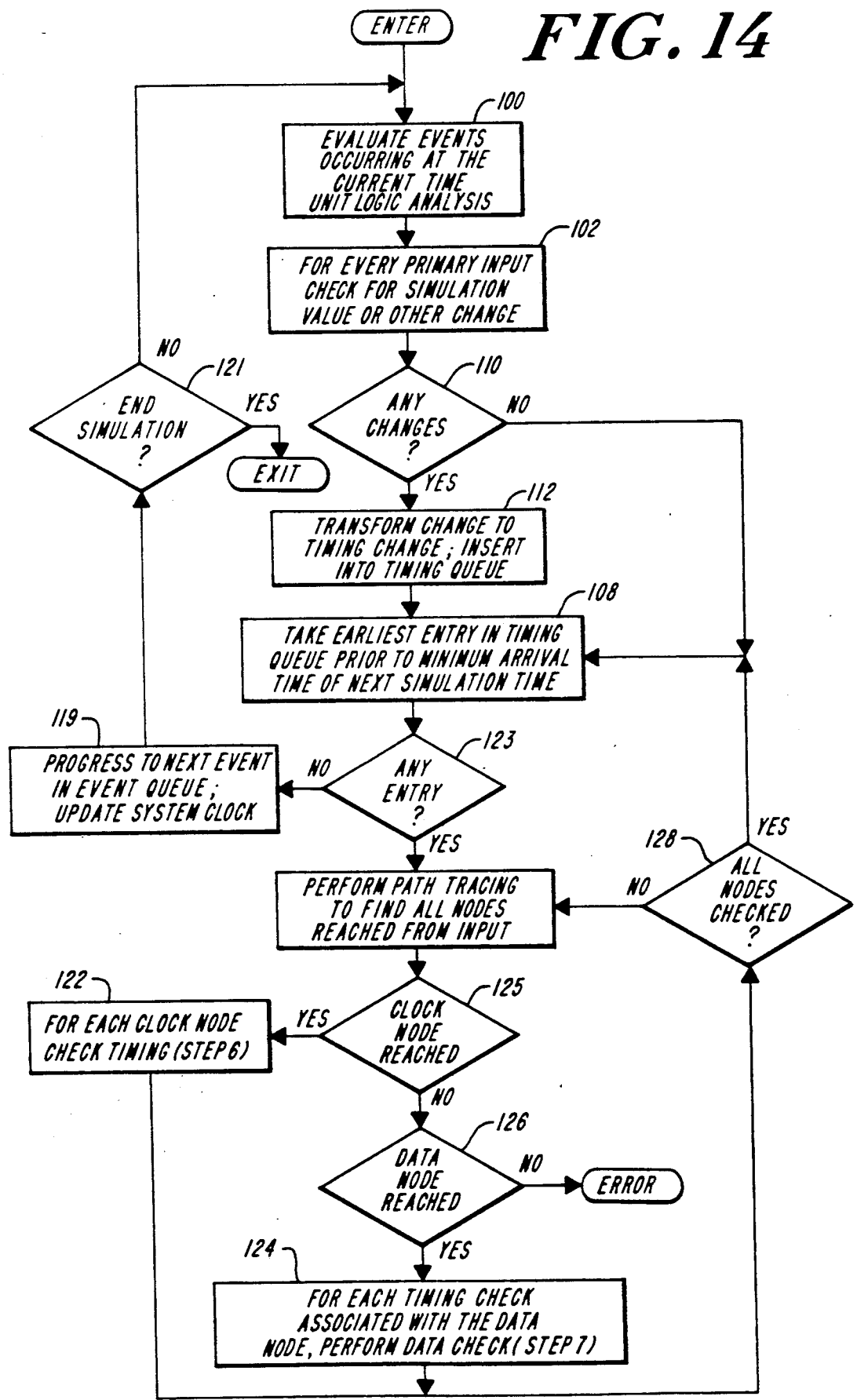
FIG. 14 is a flow diagram of features of the method of the invention.

Accordingly, referring to FIG. 14, the timing analysis method according to the invention can be summarized as employing the following steps.

1. The method and apparatus of the invention operate in an interleaved relationship with the simulation logic which determines the functional behavior of the circuitry; that is, the timing analysis system operates "in between" simulation time units. Accordingly, the first step 100 is for the simulation portion of the system to perform the logic simulation requirements corresponding to a given or current time of operation.

2. The method according to the invention then checks, at 102, all of the inputs specified by the user, the designated primary inputs, to determine, at 110, if there is any change in the simulation values. If there is a change in a simulation value, the operations below are performed; and if there is no change in the simulation values, the timing analysis portion of the method of the invention advances to step 4.

3. Any change in simulation value at the primary inputs, as determined at 110, is converted, at 112, into a timing change for a path beginning point in accordance with the simulation values at the beginning of each of the timing paths at which a change occurs. If a signal skew is specified at a path input, it is incorporated into the timing change. The timing change just generated is inserted into a timing queue according to the minimum arrival time of the changed signal at the beginning point of the path.

4. Once the timing queue has been updated for all path beginning points and this simulation time (the input stimuli from the user specified timing template has been previously entered into the timing queue), the next entry from the timing queue at 108, if any, as tested at 123, (corresponding to the change which takes place first) is used in step 5, so long as that minimum arrival time was less than the next simulation time available from the simulation queue. Steps 5-7 can now be performed for this "next" entry. Thereafter, the next succeeding entry is acted upon until all entries having timing changes with a minimum arrival time less than the next simulation time are exhausted. Once the condition of the preceding sentence occurs, the system returns along path 118, to the next event in the event queue, at 119, and if the end of simulation is not reached at 121, the system returns to step 1.

5. Path tracing is then performed at 120 to find all path ends which can be reached from the source (primary inputs or the storage device outputs) at which the timing change(s) occurred. For each path end reached along a signal propagation path, tested at 123, step 6 is performed for a path ending at a clock port (tested at 125) while step 7 is performed for a path ending at a data port (tested at 126).

6. For each timing check associated with a clock end path, the timing check for that module is performed at 122. If the timing check involves a data input to the module, path tracing is effected to find all inputs which end at that data end path and to determine all minimum/maximum timing changes, if any. For each minimum/maximum clock path pair and each minimum/maximum data path pair, a timing check is then performed. This then calls for the timing check to be performed in accordance with the preferred embodiments of the invention If there is a violation, it is a potential violation and skew manipulation will be employed to reduce the ambiguity associated with the common and correlated skew. If the timing check only involves itself, for example a pulse width or period check, the timing changes previously saved for that clock input to the module are used to determine whether a timing violation has occurred. The timing change to this clock end path is then saved for possible later use.

7. For each timing check associated with a data path end, corresponding to a module input, the timing check associated with the module is performed at 124 with the timing changes saved on the corresponding clock node. Once all eligible nodes of the design corresponding to this entry have been analyzed at 122, 124, the method returns to operate upon the next node (tested at 128) or, if there is no next node, then the next entry in the timing queue, if any.

In summary, then, the timing analysis of the preferred method of the invention is driven by the simulation analysis The simulator is used to execute timing analysis system tasks and controls the timing analysis by providing the timing at the inputs to the design During hybrid path tracing, simulation events thus trigger critical path analysis and the results of this path tracing are saved at the points in the design where the timing checks have been specified. The minimum/maximum time ranges, for clock and/or data signals, that result from path tracing will then be compared in order to evaluate each timing check.

The critical path tracing that occurs during the hybrid path analysis is directed by the set of beginning and end points, only some of which the hybrid analysis needs to be specified with user commands. The points which the user chooses, in hybrid analysis, to be the beginning points, are called primary inputs and it is a change in value at these inputs, determined for example by the simulation analysis, which initiates the hybrid analysis. The selection of primary inputs thus determines which parts of the design will be subjected to the hybrid path tracing. Only those parts of the design that fan out from the specified primary inputs will be traced.

The primary inputs can be used to bypass parts of the design that cannot be analyzed by the path tracing method directly. Thus, oscillators and pulse generators, which must be bypassed, have their outputs designated as primary inputs. Further, the user can use the primary input designation to bypass any behavioral modules that do not have paths defined through them.

In the hybrid analysis, path end points are the places in the design where the method can store the results of path tracing. Those nodes used in a timing check and all nodes specified as monitor nodes are used as path end points The results of path tracing to these end points are used to evaluate timing checks designating those points and to provide values and arrival times for display to the user.

An important consideration in choosing the beginning and end points for the critical path tracing analysis is to select points so that any global loops in a region to be analyzed will be broken. In the hybrid analysis, the system tends to do this automatically by ending path traces at the inputs to storage devices and then starting a new path trace at the output of the storage device. The system defines a storage device, for this purpose, as any module with a conditional specified path. This source of any such specified path within such a module will become an end point for the path tracing method and the destination of the specified path internal to the module will be used as a new beginning point. The hybrid analysis connects the two points in a simulation-like manner, that is, when the simulation progresses to the point in time when a signal change at the storage device input would propagate through to its output, this system triggers a new path trace starting at that output. The initial skew for the new path trace is derived from the results of the previous path trace to the storage device input.

While this method for breaking a so called global loop will solve most problems, it may be necessary for a user to insert a dummy module containing a conditional path to break a global loop if no storage devices can be clearly identified.

Whenever a path that contributes to a timing violation is identified, the full path, from the primary input to the end point at which the timing check violation occurred, may have been broken several times as a result of traversing various storage devices or a dummy storage module. Each portion of the violation path, between breaks in the path, is designated a path segment and each segment is derived from a separate path trace. For many designs, most paths will consist of two segments, for example, the segment from the clock source to one flip-flop and the segment from the flip-flop to the data input of another flip-flop. In cases where the clocks are very regular, only the last path segment is important to the user. In some large designs based on transparent latches, paths with large number of segments may exist.

It is also important to note that beginning points of a path, typically places or nodes in the design where path tracing can be triggered as a result of simulation activity, can also be designated as a beginning point as a result of an explicit CHANGE command in the timing template.

As noted above, the timing template stored 16 (FIG. 1) contains several standard features which are common to every hybrid analysis. The commands and procedures needed to operate upon these features to perform for example a simple timing analysis using the method of the invention include the following:

First, a typical structure for a circuit design which will be processed in accordance with the invention includes a top level module which has one instance of the circuit design to be tested and several behavioral sections, the behavioral sections containing the task calls and simulation stimuli which will control the timing analysis. The user can indicate to the system of the invention, for example through a keyboard input, when signal changes will occur on any of the primary inputs of the design. Sometimes it is appropriate to stimulate the design with actual patterns such as those which are effected for simulation analysis. Normally this method is used for only clock inputs. At other times, the primary inputs, other than clock inputs, are stimulated with the simulation changes, such as control inputs used to set up a case analysis. A simple procedural assignment is the simplest method to provide this form of stimulus.

Most of the time, according to the invention, only one clock cycle will need to be simulated. An exception is when the case analysis, in which the design is simulated for as many cycles as there are cases, is used. Additionally, designs based on transparent latches and designs that employ true multicycle paths will also need to be run for multiple clock cycles.

To make the timing analysis as static as possible, so that only a few cycles will need to be simulated, the method uses simulation stimuli as little as possible. Most of the design inputs will be stimulated using the system tasks, such as the CHANGE command, which explicitly trigger path tracing without the need for simulation activity. The CHANGE command has the advantage that it provides a full, value independent timing analysis of the effect of a signal change at a primary input. If all inputs are stimulated in this matter then the design can be completely analyzed in a single cycle. When the method encounters the CHANGE command during execution, the current simulation time becomes the begin time associated with the path trace and, as the path tracing proceeds, the minimum and maximum delays of each element are added to the beginning time until a range of arrival times is calculated for each of the various path end points.

In those instances where it is not possible to know the precise moment in time when an input will change, this system provides for a min/max CHANGE task command. This task command requires two time arguments which specify minimum and maximum limits of the range as offsets to the current simulation time. Since the offsets can be positive or negative, the range can be translated in time relative to the simulation time with little difficulty.

Similar task commands can affect only the change in time of occurrence of either a rise at the input or a fall at the input.

The method further provides a signal skew task controls which place a permanent skew relationship between two primary inputs so that when one input is stimulated, the second input is automatically stimulated as well. The difference between the minimum and maximum begin times is known as the skew for the signal. The signal skew command can be designated with regard to either the rise time or the fall time of the initial primary signal. These tasks thus provide a permanent skew relationship between two inputs which is value independent. For example, a primary input clock rise can be defined to trigger a rise at an address for that module which occurs anywhere within a range of time later. These two task commands can also establish an initial skew at a single primary input in response to a simulation event. Thus, if the simulation event occurred at for example time 100, the skew task commands can define a range of begin times from for example 92 to 115, if the triggering event were a rise and from 92 to 110 if it were a fall in signal level.

The output of the method and apparatus of the claimed invention, the timing violations 18 of FIG. 1, is a list of violation messages describing where in the design timing problems are likely to occur. The timing violations are always the result of path tracing to a node specified in a timing check, typically an input port of a module containing the check. The path tracing results can be stored at that node for comparison against other path tracing results that are calculated. In accordance with the claimed invention, the user has a number of options for controlling how the timing violations are treated, and how the paths responsible for the violations should be displayed. Since all timing violations generally involve two paths, typically a clock path and a data path, the method generally identifies a distinct pair of paths which are the most critical paths responsible for the violation. Thus, of all possible paths that lead to the timing check error or violation, the method selects the two paths that cause the "greatest" violation.

During an actual timing analysis, the violation display can, when a timing violation is detected, optionally report either nothing, a summary of the violation, or all a list of the paths leading to the violation. The selected option is set by the user. When "nothing" is displayed at the time the violation is first detected, the details concerning the violation are automatically saved for later inspection. The no-display setting can also be used to weed out uninteresting violations from the analysis. The summary display prints a summary message about each violation as it is detected. Typically the message includes the type of violation, the length of the violation, and the actual timing check as it appears in the file which created that check. If all of the paths leading to the node at which a timing violation occurred are to be identified each time a violation occurs, the system will supplement each of the summary messages with a list of the actual paths responsible for the violation. The paths can be displayed either by limiting the number of segments leading to the violation, by providing a full history of the violation, or as a default, identifying in the display only the final segment leading to the violation.

If the violations are saved, the system can display them, after the timing analysis is completed, either in a summary report describing all of the violations which were detected and saved, or in a detailed report providing substantially more information. Typically, it is useful to save the violations and inspect them after the analysis is complete so as to provide an all-inclusive final report before deciding which violations to investigate further. Also, a complete report better enables the user to determine whether violations belong to a common timing check. For example, if there were four cycles of the system, the four resulting violations can be summarized in one message.

During either the hybrid analysis or a static analysis, the method also allows the user to specify how many paths should be traced. This feature controls the execution time for the timing analysis. As mentioned above, only the longest and shortest paths are needed to be sure there is no violation. However, if a timing violation occurs, it is difficult for the user to identify and correct the problem since all delays on those violation paths are candidates to be fixed. Thus it may take several trials to find the proper component to be corrected. Further, a correction on one path may resolve the timing difficulty for that path but, for example, a second longest path may still cause a violation. Thus by checking more than one path, the user may be able to pinpoint the "violation area" more accurately. Accordingly, time can be more productively spent correcting those components shared by more than one violation path. This is quite useful in correcting a timing violation.

A special problem for the timing analysis method results from the use, in a global feedback loop, of solely transparent latches to regulate the critical flow of data around the loop. Thus, while global loops do not present a problem if they contain storage devices that are clock driven, a problem does occur when the devices in the loop are data driven. The normal path analysis will not produce correct results for these data driven loops, primarily because there is no method for being certain where to begin the path tracing method. In accordance with the invention, however, there is provided a special function that can be used in conjunction with the hybrid analysis to guarantee successful analysis of such latch-based designs.

The latches can thus be used in two different ways, they may be clock driven or data driven depending on how their transparent state is used. As noted above, clock driven latches affect the timing analysis just the way flip-flops do. Their output change is determined by a clock arrival time. Data driven latches are latches which may be in an open (pass through) state when the changed data arrives at the input. As with all storage devices, the system makes the data output of a latch a history point that triggers a path analysis when a change arrives. When that change is traced to the data input of a latch, the system determines if the latch is in the open state. If it is, then the arrival of data at the input causes a history entry at the output just as an opening edge arriving at the clock input will cause such a history entry.

Figure 13:
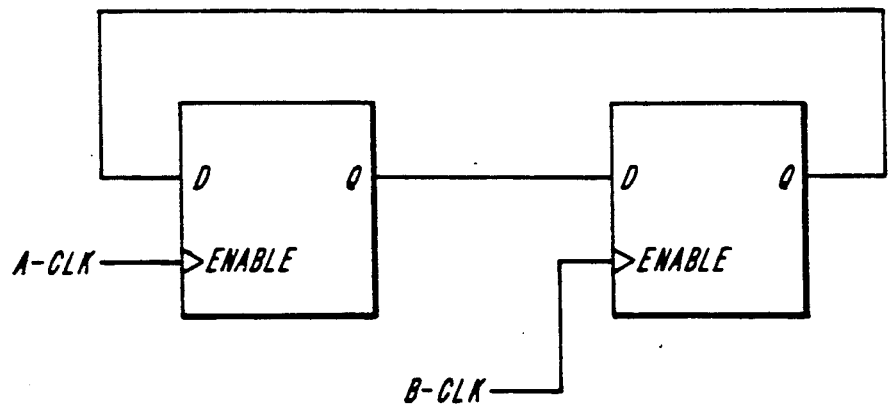
FIG. 13 illustrates a latch based design in accordance with the invention.

Thus, a design style, that is sometimes used in designs where the cycle time is critical, permits the critical loops in the design to only have data driven latches. This "style" allows the design to operate with a cycle time that does not have to wait upon the setup time of the latch, and in some of the longer paths, the cycle time can "borrow" time from those paths that precede them. This is a difficult design to verify during the timing analysis. The timing analyzer for such a latch-based design is faced with the chicken and the egg problem. Referring to FIG. 13, in a two phase clock where every path goes from an "A" phase latch to a "B" phase latch, and then back to an "A" phase latch, the analysis of the paths from the "A" phase latches to the "B" phase latch requires the system to know when the data arrives at the "A" phase latch. However, to determine that time, the system must use the path starting at the "B" phase latches. The attempt to find the starting point has thus gone into a loop. The analysis system 14 solves this difficulty by providing means for allowing the user to iterate over the paths until the actual data arrival times have propagated through the design, stabilize, and result in a correct path analysis. Thus, referring to FIG. 13, the analysis system 14 only has to loop twice through the circuitry of FIG. 13 if the timing is correct. After the first time, the system evaluates the "B" phase latch, and the timing of the "A" phase latch will then be correct. However, it will have to loop a third time to ensure that two passes through the loop was sufficient. It can determine this by noting that no arrival times have changed at the latches between the second and third loops.

If the timing is still incorrect, the analysis can continuously loop many times, with the arrival time of the data advancing later in each cycle, until the data arrives after one of the latches is in the latched state. This will provoke a timing violation, and the loops will stabilize since the latch will not have changed any later then when the clock input changed to the latched state.

The system thus provides a latch change function to enable the user to set up the proper iterations for the analysis of a latch-based design. This function returns a value that only changes when a latch experiences a change on its data input during an open state and only if that change arrives later than it did during the previous cycle. The user should have the system loop, simulating cycles of the design, until no latches cause a "latch change" to change. In particular, the latch change function returns the difference in time from the maximum arrival of an opening clock edge to the maximum arrival of a data change, for any latch in the design, for which the interval has become larger and for which the difference is smaller than the value that the "latch change" would otherwise return. The user initializes the return value of the "latch change" with an argument provided to it. By initializing the command to a large value each cycle, the system will determine and identify if any latches saw a later data arrival time than on the previous cycle.

In accordance with the invention, the path tracing method can typically be triggered into a hybrid analysis by one of three events. It can be triggered by any simulation value change that occurs at a primary input; it can be triggered by a "CHANGE" task that specifies one or more primary inputs; or it can be triggered when a conditional path through a storage device is enabled (a new path will be triggered at the output of the internal device path as soon as the simulation time reaches the minimum time at which a value could arrive there).

In accordance with the illustrated embodiment of the invention, a fourth event can be employed for triggering hybrid path tracing, that is, the user can set a trigger tracing task so that the output of any conditional path will be treated like a primary input and any simulation event which occurs at that output will effect or trigger a new path trace from that output onward. This option is not commonly used; and typically, only output or in/out ports from a conditional path will be designated a primary input if the path tracing results have been stored at its corresponding input. In this more common mode of operation, therefore, simulated values alone do not trigger a new path trace at a conditional path output.

It is also necessary to note that, in accordance with the illustrated embodiment of the invention, the system does not verify the stability of a conditioning signal over an entire time frame for which it is needed. Thus, a signal, such as a clear or preset input to a flip-flop, is evaluated at that single point in time, the minimum time that a signal would arrive to enable the conditional path, and no attempt is made to ensure that the conditioning signal remains stable over the entire range of time necessary for the device to operate in its intended manner.

The illustrated embodiment of the invention also provides for path pruning based upon simulation values that are present at the time that the path tracing occurs. As described previously, path tracing occurs when something happens at the beginning of a path (the primary inputs). This path tracing operation takes place instantly with respect to simulation time, that is, the method looks forward in time while the logic simulation is frozen at the current simulation time. If a pruning value is to work correctly, it must be allowed to propagate to its intended destination prior to the time simulation is frozen. In many cases therefore the user must provide that the pruning values arrive prior to the time the simulation method would otherwise provide them.

For example, when both the pruning values and the trigger for the paths to be pruned are generated on the same clock edge, the pruning values will not have time to propagate to their destinations before the data paths are traced. One solution to this paradox is to provide the pruning values early, using a so called FORCE declaration or statement. Further, since each beginning point initiates a separate path trace, when triggered, the path pruning value must last long enough to cover the entire range of trigger times for all of the various beginning points that fan into the pruning gate. In addition, when a path trace to a clock input of a timing check occurs after a trace to the data input of that check, the critical paths leading to the data input are retraced. Therefore, for any unwanted path to the data input, the pruning value must still be in effect at both times during which the data path is traced.

Further, as noted above, since the illustrated embodiment of the invention does not verify the stability of a pruning value over the entire time frame for which it is needed, the user, in this illustrated embodiment, must ensure that that pruning value remains stable over the entire required range of time to accomplish the desired pruning.

Additions, subtractions, deletions and other modifications of the preferred embodiment of the invention will be apparent to one practiced in the art and are within the scope of the following claims.

What is claimed is:

1. A method for performing a timing analysis simulation upon a digital circuit design comprising the steps of
   inputting said digital circuit design to an analysis apparatus,
   simulating a logical function evaluation of said design for each of successive simulation time instants,
   performing a timing analysis of said digital circuit design using a path tracing analysis of said design from designated inputs to end points of signal propagation paths beginning at said designated inputs, and
   eliminating paths subject to said path tracing analysis depending upon the signal value results of said simulation step at said designated inputs.

2. The method of claim 1 further comprising the step of
   performing a timing analysis of said digital circuit design using a hybrid path tracing analysis of said design from designated inputs to end points of signal propagation paths beginning at said designated inputs whenever the value of signals at said designated inputs varies as a result of said simulating step.

3. The method of claim 1 further wherein
   said performing step comprises
      determining a shortest and a longest delay path between said designated inputs and end points of said paths, and
      saving the violation history of only the two paths representing the longest and shortest paths from a designated input to a said end point.

4. The method of claim 1 further comprising the steps of
   inputting a user specified timing template to said apparatus, and
   setting input stimuli with regard to at least one of said designated inputs in accordance with said user specified timing template for determining the timing behavior of the digital circuit to be tested.

5. The method of claim 1 further comprising the step of
   providing for iteration of stimuli at designated inputs for checking the timing of a digital circuit design having a loop containing at least one transparent latch.

6. A method for performing a timing analysis simulation upon a digital circuit design comprising the steps of
   inputting a user specified timing template,
   simulating a logical function evaluation of said design for each successive simulation time instance,
   performing a timing analysis of said digital circuit design using a hybrid path tracing analysis of said design from designated inputs to end points of signal propagation paths beginning at said designated inputs whenever the value of signals at said designated inputs varies as a result of said simulating step, and
   outputting the results of said time analysis for display to an end user.

7. The method of claim 6 further wherein said performing step comprises
   determining a shortest and a longest delay path between said designated inputs and end points of said paths, and
   saving the violation history of only the two paths representing the longest and shortest paths from a designated input to a said end point.

8. The method of claim 6 further comprising the steps of
   inputting a user specified timing template to said apparatus, and setting the input stimuli with regard to at least one of said designated inputs in accordance with said user specified timing template for determining the timing behavior of the digital circuit to be tested.

9. The method of claim 6 further comprising the step of
providing for iteration of stimuli at designated inputs for checking the timing of a digital circuit design having a loop containing at least one transparent latch.

10. A method for performing a timing analysis simulation upon a digital circuit design comprising the steps of
inputting said digital circuit design to an analysis system,
simulating a logical function evaluation of said design for each of successive simulation time instants,
performing a timing analysis of said digital circuit design using a path tracing analysis of said design from designated inputs to end points of signal propagation paths beginning at said inputs, said performing step comprising,
determining a shortest and a longest delay path between said designated inputs and end points of said paths, and
saving the timing violation history of only the two paths representing the longest and shortest paths from a designated input to a said end point, and
displaying the timing violation history of the saved paths to an end user.

11. The method of claim 10 further comprising the steps of
inputting a user specified timing template to said apparatus, and
setting the input stimuli with regard to at least one of said designated inputs in accordance with said user specified timing template for determining the timing behavior of the digital circuit to be tested.

12. The method of claim 10 further comprising the steps of
providing for iteration of stimuli at designated inputs for checking the timing of a digital circuit design having a loop containing at least one transparent latch.

13. A method for performing a timing analysis simulation upon a digital circuit design comprising the steps of
inputting said digital circuit design to an analysis apparatus,
inputting a user specified timing template to said apparatus,
simulating a logical function evaluation of said design for each of successive simulation time instants,
performing a timing analysis of said digital circuit design using a path tracing analysis of said design from designated inputs to end points of signal propagation paths beginning at said inputs,
setting the input stimuli with regard to at least one of said designated inputs in accordance with said user specified timing template for determining the timing behavior of the digital circuit to be tested, and
displaying the timing violation history of paths as a result of said timing analysis of said digital circuit design.

14. The method of claim 13 further comprising the step of
providing for iteration of stimuli at designated inputs for checking the timing of a digital circuit design having a loop containing at least one transparent latch.

15. A method for performing a timing analysis simulation upon a digital circuit design comprising the steps of
inputting the digital circuit design to an analysis apparatus,
simulating a logical function evaluation of said design for each of successive simulation time instants,
performing a timing analysis of said digital circuit design using a path tracing analysis of said design from designated inputs to end points of signal propagation paths starting at said designated inputs,
providing for iteration of stimuli at designated inputs for checking the timing of a digital circuit design having a loop containing at least one transparent latch, and
displaying to an end user a timing violation history for said digital circuit design.

16. A method for performing a timing analysis simulation upon a digital circuit design comprising the steps of
inputting said digital circuit design to an analysis apparatus,
simulating a logical function evaluation of said design for each of successive simulation time instants,
performing a timing analysis of said digital circuit design using a path tracing analysis of said design from designated inputs to end points of signal propagation paths beginning at said designated inputs,
eliminating paths subject to said path tracing analysis depending upon the signal value results of said simulation step at said designated inputs,
said performing step comprising
determining a shortest and a longest delay path between said designated inputs and end points of said paths, and
saving the timing violation history of only the two paths representing the longest and shortest paths from a designated input to a said end point,
performing a timing analysis of said digital circuit design using a hybrid path tracing analysis of said design from designated inputs to end points of signal propagation paths beginning at said designated inputs whenever the value of signals at said designated inputs varies as a result of said simulating step,
inputting a user specified timing template to said apparatus,
setting the input stimuli with regard to at least one of said designated inputs in accordance with said user specified timing template for determining the timing behavior of the digital circuit to be tested,
providing for iteration of stimuli at designated inputs for checking the timing of a digital circuit design having a loop containing at least one transparent latch, and
displaying to an end user a timing violation history for said digital circuit design.

17. Apparatus for performing a timing analysis simulation upon a digital circuit design comprising
means for inputting said digital circuit design to an analysis apparatus,
means for simulating a logical function evaluation of said design for each of successive simulation time instants,
means for performing a timing analysis of said digital circuit design using a path tracing analysis of said design from designated inputs to end points of signal propagation paths beginning at said designated inputs, and means for eliminating paths subject to said path tracing analysis depending upon the signal value results of said simulation step at said designated inputs.

18. Apparatus according to claim 17 further comprising
means for performing a timing analysis of said digital circuit design using a hybrid path tracing analysis of said design from designated inputs to end points of signal propagation paths beginning at said designated inputs whenever the value of signals at said designated inputs varies as a result of said simulating step.

19. Apparatus according to claim 17 wherein said performing means comprises
means for determining a shortest and a longest delay path between said designated inputs and end points of said paths, and
means for saving the violation history of only the two paths representing the longest and shortest paths from a designated input to a said end point.

20. Apparatus according to claim 17 further comprising
means for inputting a user specified timing template, and
means for setting the input stimuli with regard to at least one of said designated inputs in accordance with said user specified timing template for determining the timing behavior of the digital circuit to be tested.

21. Apparatus according to claim 17 further comprising
means for providing for iteration of stimuli at designated inputs for checking the timing of a digital circuit design having a loop containing transparent latches.

22. Apparatus for performing a timing analysis simulation upon a digital circuit design comprising
means for inputting said digital circuit design to an analysis apparatus,
means for simulating a logical function evaluation of said design for each successive simulation time instance,
means for performing a timing analysis of said digital circuit design using a hybrid path tracing analysis of said design from designated inputs to end points of signal propagation paths beginning at said designated inputs whenever the value of signals at said designated inputs varies as a result of said simulating step, and
means for outputting the results of said time analysis for display to an end user.

23. Apparatus according to claim 22 wherein said performing means comprises
means for determining a shortest and a longest delay path between said designated inputs and end points of said paths, and
means for saving the violation history of only the two paths representing the longest and shortest paths from a designated input to a said end point.

24. Apparatus according to claim 22 further comprising
means for inputting a user specified timing template, and
means for setting the input stimuli with regard to at least one of said designated inputs in accordance with said user specified timing template for determining the timing behavior of the digital circuit to be tested.

25. Apparatus according to claim 22 further comprising
means for providing for iteration of stimuli at designated inputs for checking the timing of a digital circuit design having a loop containing transparent latches.

26. Apparatus for performing a timing analysis simulation upon a digital circuit design comprising
means for inputting said digital circuit design to the analysis apparatus,
means for simulating a logical function evaluation of said design for each of successive simulation time instants,
means for performing a timing analysis of said digital circuit design using a path tracing analysis of said design from designated inputs to end points of signal propagation paths beginning at said designated inputs, said performing means comprising
means for determining a shortest and a longest delay path between said designated inputs and end points of said paths, and
means for saving the timing violation history of only the two paths representing the longest and shortest paths from a designated input to a said end point, and
means or displaying the timing violation history of the saved paths to an end user.

27. Apparatus according to claim 26 further comprising
means for inputting a user specified timing template, and
means for setting the input stimuli with regard to at least one of said designated inputs in accordance with said user specified timing template for determining the timing behavior of the digital circuit to be tested.

28. Apparatus according to claim 26 further comprising
means for providing for iteration of stimuli at designated inputs for checking the timing of a digital circuit design having a loop containing transparent latches.

29. Apparatus for performing a timing analysis simulation upon a digital circuit design comprising
means for inputting said digital circuit design to said apparatus,
means for inputting a user specified timing template,
means for simulating a logical function evaluation of said design for each of successive simulation time instants,
means for performing a timing analysis of said digital circuit design using a path tracing analysis of said design from designated inputs to end points of signal propagation paths beginning at said designated inputs,
means for setting the input stimuli with regard to at least one of said designated inputs in accordance with said user specified timing template for determining the timing behavior of the digital circuit to be tested, and
means for displaying the timing violation history of paths as a result of said timing analysis of said digital circuit design.

30. Apparatus according to claim 29 further comprising
means for providing for iteration of stimuli at designated inputs for checking the timing of a digital circuit design having a loop containing transparent latches.

31. Apparatus for performing a timing analysis simulation upon a digital circuit design comprising
  means for inputting the digital circuit design to said apparatus,
  means for simulating a logical function evaluation of said design for each of successive simulation time instants,
  means for performing a timing analysis of said digital circuit design using a path tracing analysis of said design from designated inputs to end points of signal propagation paths starting at said designated inputs,
  means for providing for iteration of stimuli at designated inputs for checking the timing of a digital circuit design having a loop containing transparent latches, and
  means for displaying to an end user a timing violation history for said digital circuit design.

32. Apparatus for performing a timing analysis simulation upon a digital circuit design comprising
  means for inputting said digital circuit design to an analysis apparatus,
  means for simulating a logical function evaluation of said design for each of successive simulation time instants,
  means for performing a timing analysis of said digital circuit design using a path tracing analysis of said design from designated inputs to end points of signal propagation paths beginning at said designated inputs,
  means for eliminating paths subject to said path tracing analysis depending upon the signal value results of said simulation step at said designated inputs,
  said performing means comprising
    means for determining a shortest and a longest delay path between said designated inputs and end points of said paths, and
    means for saving the timing violation history of only the two paths representing the longest and shortest paths from a designated input to a said end point,
  means for performing a timing analysis of said digital circuit design using a hybrid path tracing analysis of said design from designated inputs to end points of signal propagation paths beginning at said designated inputs whenever the value of signals at said designated inputs varies as a result of said simulating step,
  means for inputting a user specified timing template,
  means for setting the input stimuli with regard to at least one of said designated inputs n accordance with said user specified timing template for determining the timing behavior of the digital circuit to be tested,
  means for providing for iteration of stimuli at designated inputs for checking the timing of a digital circuit design having a loop containing transparent latches, and
  means for displaying to an end user a timing violation history for said digital circuit design.

* * * * *